(12) United States Patent
Watanabe

(10) Patent No.: US 12,295,117 B2
(45) Date of Patent: May 6, 2025

(54) AUDIO RECORDING APPARATUS, IMAGE CAPTURING APPARATUS, CONTROL METHOD, AND STORAGE MEDIUM

(71) Applicant: CANON KABUSHIKI KAISHA, Tokyo (JP)

(72) Inventor: Akira Watanabe, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 244 days.

(21) Appl. No.: 18/065,028

(22) Filed: Dec. 13, 2022

(65) Prior Publication Data

US 2023/0200004 A1  Jun. 22, 2023

(30) Foreign Application Priority Data

Dec. 17, 2021  (JP) .................... 2021-205467

(51) Int. Cl.
| | | |
|---|---|---|
| H04N 9/80 | (2006.01) | |
| H04R 1/02 | (2006.01) | |
| H04R 1/04 | (2006.01) | |
| H04R 1/08 | (2006.01) | |
| H04R 1/32 | (2006.01) | |
| H04R 3/00 | (2006.01) | |
| H05K 7/20 | (2006.01) | |

(52) U.S. Cl.
CPC ......... *H05K 7/20209* (2013.01); *H04R 1/028* (2013.01); *H04R 1/04* (2013.01); *H04R 1/08* (2013.01); *H04R 1/326* (2013.01); *H04R 3/00* (2013.01); *H05K 7/20136* (2013.01); *H04R 2420/07* (2013.01); *H04R 2499/11* (2013.01); *H05K 7/20145* (2013.01)

(58) Field of Classification Search
CPC ...... H05K 7/20209; H04R 1/028; H04R 1/04; H04R 2420/07; H04R 2499/11
USPC ....................................... 381/91, 87
See application file for complete search history.

(56) References Cited

U.S. PATENT DOCUMENTS

| | | | | |
|---|---|---|---|---|
| 11,972,672 | B1 * | 4/2024 | Dunn ................. | G08B 21/18 |
| 2004/0032509 | A1 * | 2/2004 | Owens ................ | H04N 5/772 |
| | | | | 348/241 |
| 2006/0168114 | A1 * | 7/2006 | Glatron ............ | G11B 20/10527 |
| | | | | 709/228 |
| 2009/0106029 | A1 * | 4/2009 | DeLine .............. | B60R 11/02 |
| | | | | 704/E21.001 |
| 2014/0030104 | A1 * | 1/2014 | Lee .................. | F04D 29/327 |
| | | | | 416/223 R |

(Continued)

FOREIGN PATENT DOCUMENTS

JP    2010-062892 A    3/2010

*Primary Examiner* — William J Deane, Jr.
(74) *Attorney, Agent, or Firm* — Cowan, Liebowitz & Latman, P.C.

(57) ABSTRACT

An audio recording apparatus provided with a heat radiation fan comprises at least one processor and/or circuit configured to function as following units: an acquiring unit configured to acquire a type of microphone used to record audio; a control unit configured to control a rotation frequency for driving the heat radiation fan; and a recording unit configured to record audio acquired by the used microphone, wherein the control unit changes the rotation frequency of the heat radiation fan according to the type of the used microphone acquired by the acquiring unit.

13 Claims, 9 Drawing Sheets

(56) References Cited

U.S. PATENT DOCUMENTS

2014/0103346 A1\* 4/2014 Yamazaki ......... H01L 29/41733
 257/66
2020/0251122 A1\* 8/2020 Huang ................... G06F 3/165

\* cited by examiner

F I G. 6
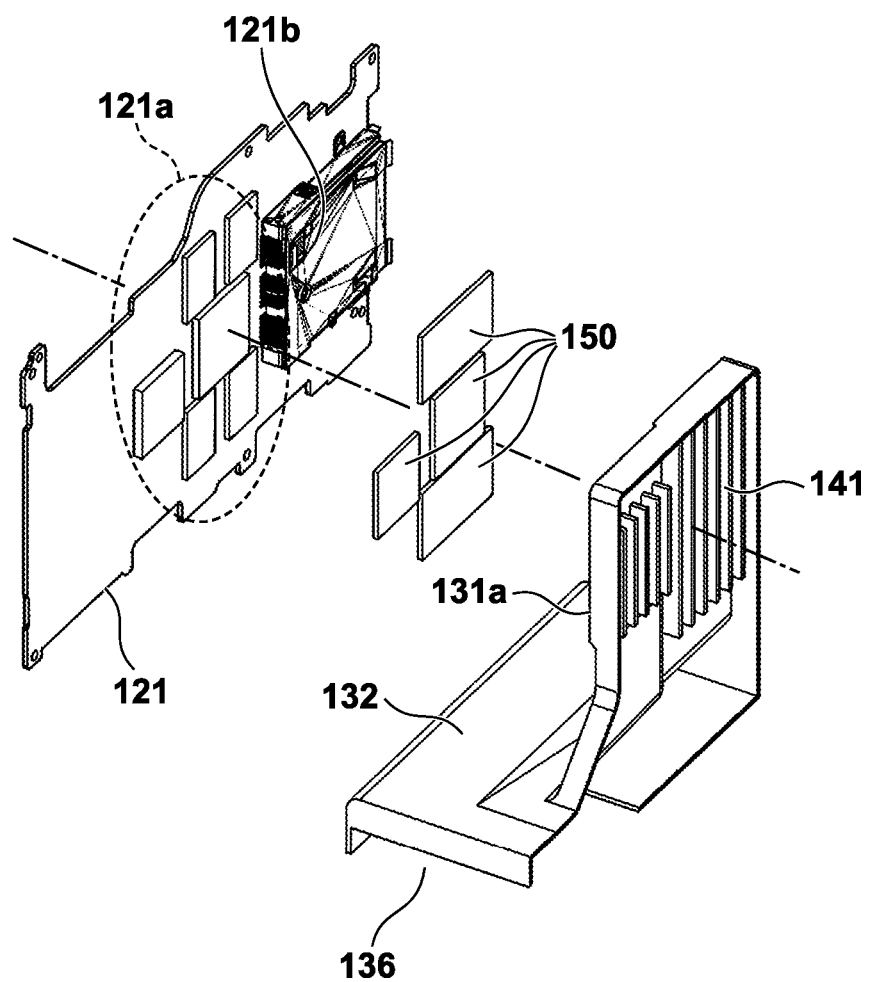

AUDIO RECORDING APPARATUS, IMAGE CAPTURING APPARATUS, CONTROL METHOD, AND STORAGE MEDIUM

BACKGROUND OF THE INVENTION

Field of the Invention

The present invention relates to an audio recording apparatus, an image capturing apparatus, a control method, and a storage medium and particularly relates to an audio recording technique for an apparatus provided with a heat radiation fan (cooling fan).

Description of the Related Art

As electronic devices become more compact and performance increases, various components such as integrated circuits installed inside a device need to be made smaller and with higher density. However, with the increase in performance of the devices, the amount of calculations in the integrated circuits and the like needs to increase, and the amount of heat generated during operation also increases. Accordingly, to avoid malfunctions, function reduction, and failures caused by an increase in the temperature inside such electronic devices, heat radiation has been addressed by installing heat radiation fans, heat conducting members such as heat sinks, and the like.

However, when a heat radiation fan is installed in an image capturing apparatus, particularly one with a moving image capture function, the operating noise of the heat radiation fan may be picked up by the microphone and recorded. In Japanese Patent Laid-Open No. 2010-062892, an image capturing apparatus is described that decreases the rotation frequency of a heat radiation fan when capturing moving images using a built-in microphone.

However, decreasing the rotation frequency of the heat radiation fan may lead to a decrease in function. Thus, as in Japanese Patent Laid-Open No. 2010-062892, with a configuration in which the rotation frequency of the heat radiation fan is uniformly reduced when a built-in microphone is used, the recordable time may be reduced and other similar unwanted restriction may be placed on the user.

SUMMARY OF THE INVENTION

The present invention was made in light of the problems described above and provides an audio recording apparatus capable of driving a heat radiation fan at a suitable rotation frequency when recording audio, an image capturing apparatus, a control method, and a storage medium.

The present invention in its first aspect provides an audio recording apparatus provided with a heat radiation fan comprising at least one processor and/or circuit configured to function as following units: an acquiring unit configured to acquire a type of microphone used to record audio; a control unit configured to control a rotation frequency for driving the heat radiation fan; and a recording unit configured to record audio acquired by the used microphone, wherein the control unit changes the rotation frequency of the heat radiation fan according to the type of the used microphone acquired by the acquiring unit.

The present invention in its second aspect provides an image capturing apparatus capable of capturing moving images comprising: an image capturing unit; and the audio recording apparatus of the first aspect.

The present invention in its third aspect provides a control method for an audio recording apparatus provided with a heat radiation fan comprising: acquiring a type of microphone used to record audio; controlling a rotation frequency for driving the heat radiation fan; and recording audio acquired by the used microphone, wherein in the controlling, control is performed to change a rotation frequency of the heat radiation fan according to the acquired type of the used microphone.

The present invention in its fourth aspect provides a computer-readable storage medium storing a program configured to cause a computer provided with a heat radiation fan to function as the units of the audio recording apparatus of the first aspect.

Further features of the present invention will become apparent from the following description of exemplary embodiments (with reference to the attached drawings).

BRIEF DESCRIPTION OF THE DRAWINGS

FIG. 6 is a diagram illustrating the relationship between the duct 122 and a main circuit board 121 according to the embodiment and the modifications of the present invention.

DESCRIPTION OF THE EMBODIMENTS

Embodiments

Figure 1:
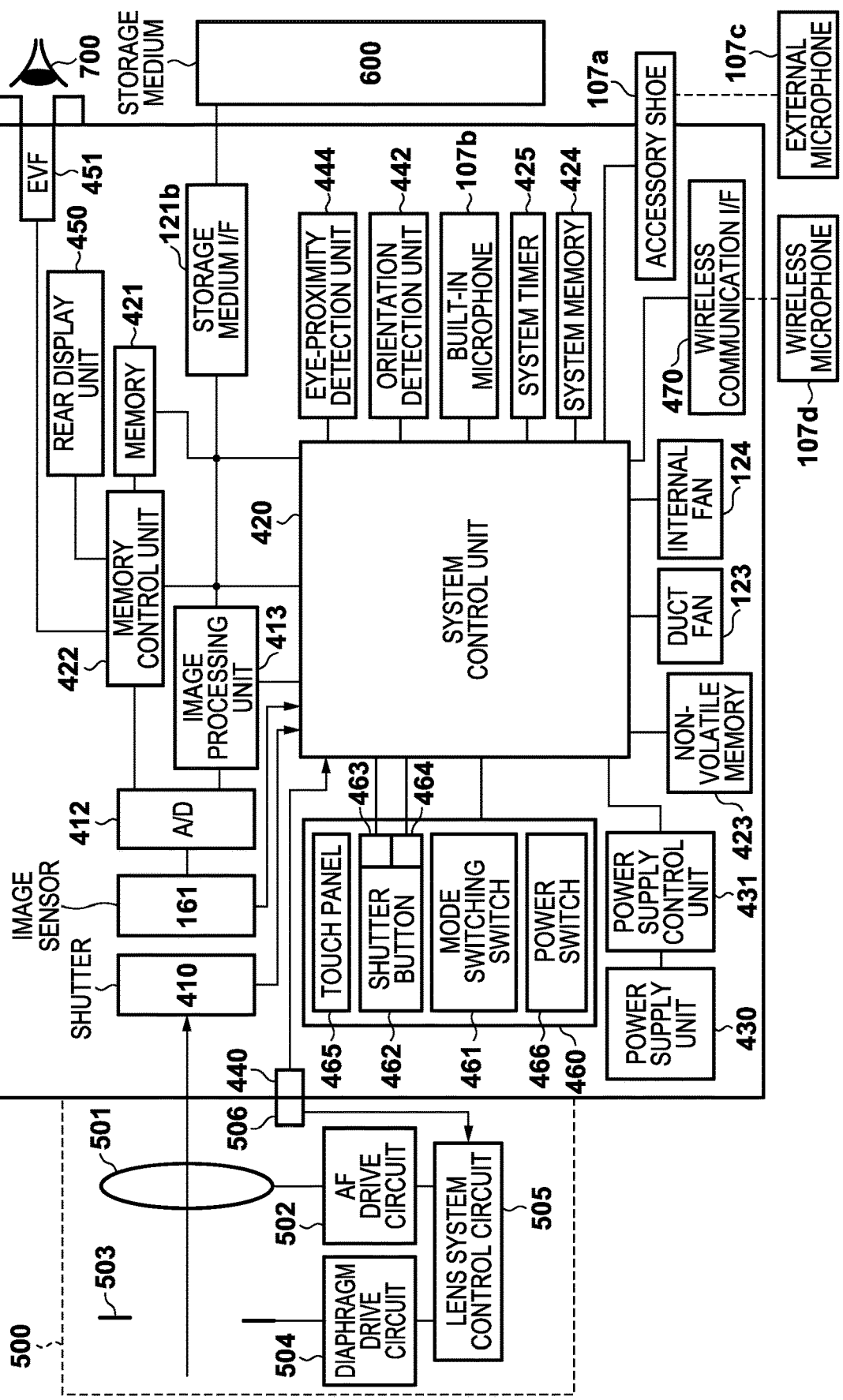
FIG. 1 is a block diagram illustrating the functional configuration of a digital camera 100 according to an embodiment and modifications of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the following description of an embodiment of the present invention, an example is used in which a digital camera capable of capturing moving images is used as an example of an audio recording apparatus. However, the present invention is applicable to any device capable of recording audio. Also, in the present specification, "heat radiation fan" includes in its meaning fans that produce an airflow for cooling a predetermined member that generates heat and fans provided for intake and exhaust to discharge an airflow outside a housing. The heat radiation fan is a member capable of pumping air by a motor driving the rotation of a propeller (blade) and producing an airflow to allow air to escape in a predetermined direction.

Configuration of Digital Camera 100

Figure 2A:
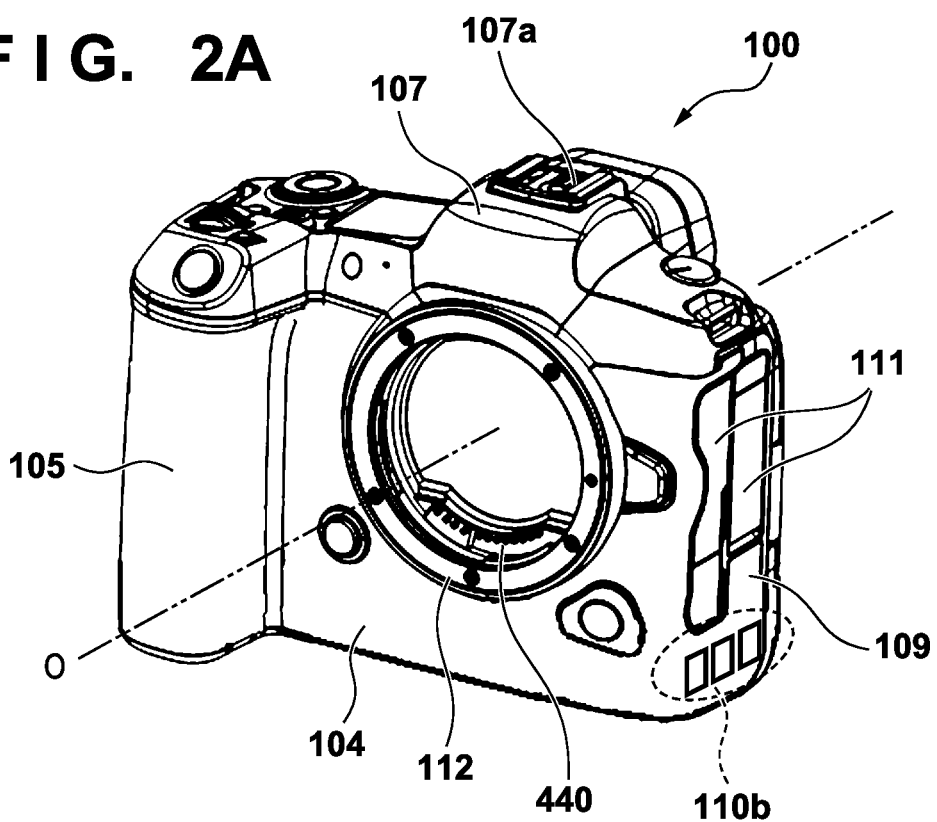
FIGS. 2A and 2B are perspective views illustrating the digital camera 100 according to the embodiment and the modifications of the present invention.
Figure 2B:
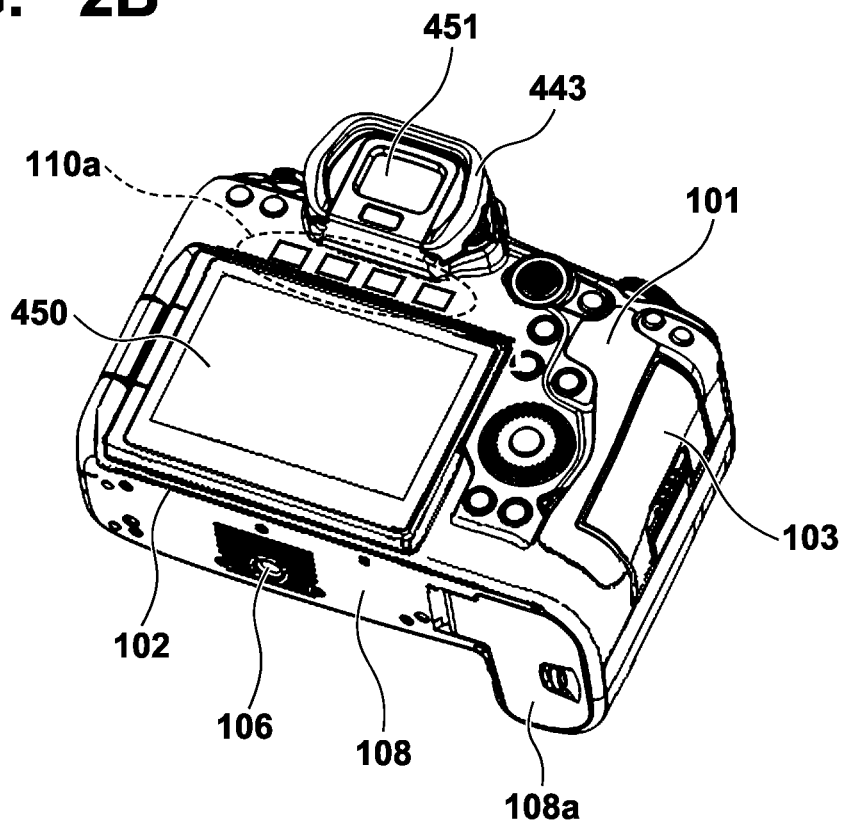
Figure 3:
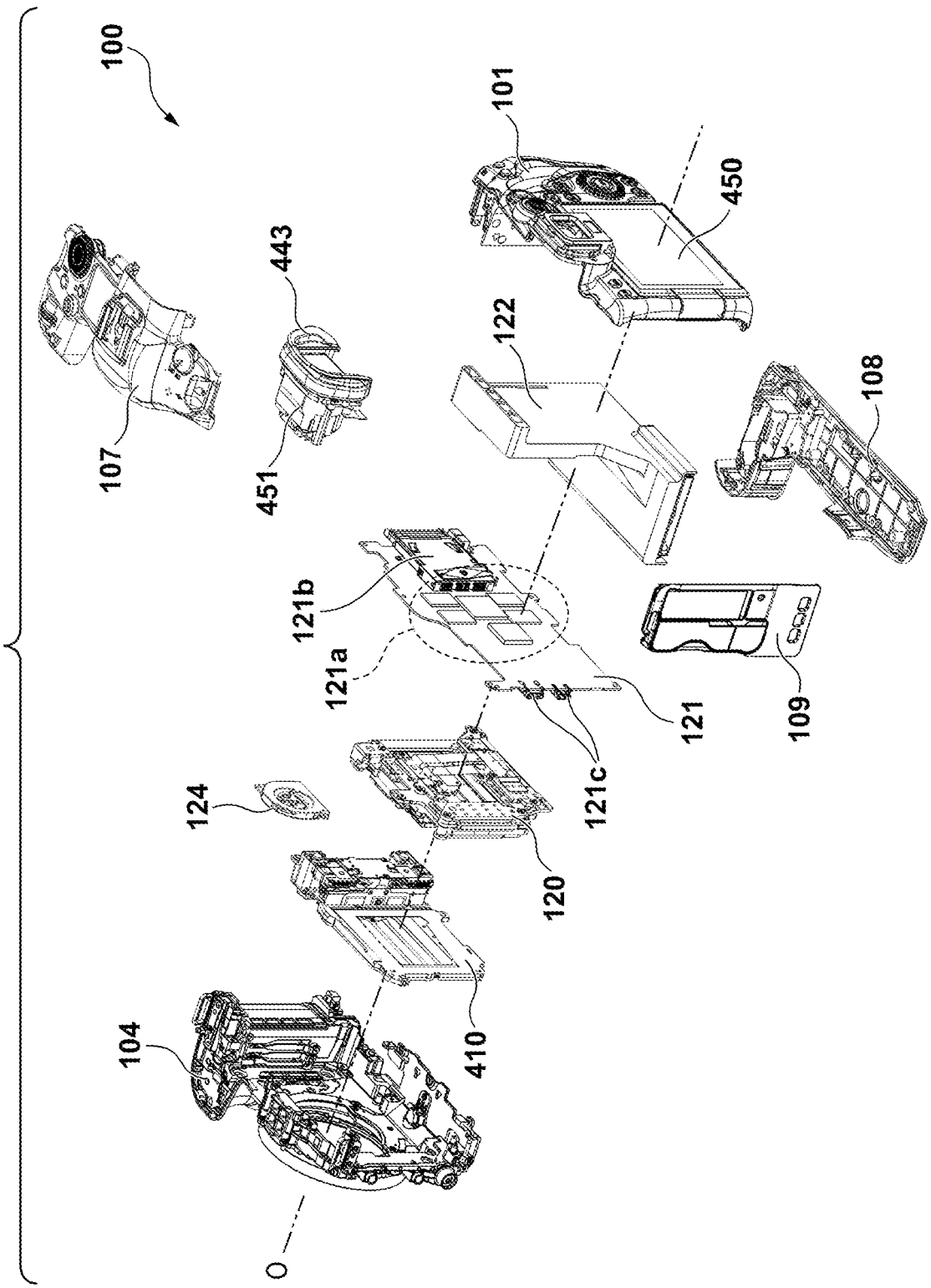
FIG. 3 is an exploded perspective view illustrating the digital camera 100 according to the embodiment and the modifications of the present invention.

The configuration of a digital camera 100 according to the present embodiment will be described with reference to FIGS. 1 to 3. FIG. 1 is a block diagram illustrating a functional configuration of the digital camera 100 according to an embodiment of the present invention. FIG. 2A is a front surface perspective view of the digital camera 100, and FIG. 2B is a back surface perspective view of the digital camera 100. FIG. 3 is an exploded perspective view of a main portion for describing the internal structure of the digital camera 100.

As illustrated in FIG. 3, the digital camera 100 includes a housing outer cover formed from a rear cover 101, a front base 104, a top cover 107, a bottom cover 108, and a side cover 109. Also, inside the digital camera 100, an image capturing unit 120, a main circuit board 121, a duct 122, a shutter 410, and an EVF 451 are disposed. A grip portion 105 is integrally formed with the front base 104 and is formed in a shape that is easy to grip with the right hand when the digital camera 100 is held by a user. Also, a tripod socket 106 illustrated in FIG. 2B is a member for attaching a tripod to the digital camera 100.

The main circuit board 121 includes a control IC group 121a that controls captured image signals, a storage medium I/F 121b, and an external communication terminal 121c for connecting to a not-illustrated external device via a cable. Also, various ICs, a chip resistor, a chip capacitor, an inductor, a transistor, an interface connector, and other electronic components may be mounted on the main circuit board 121. The external communication terminal 121c is protected by a terminal cover 111 illustrated in FIG. 2A.

In FIG. 1, the shutter 410 is a focal-plane shutter capable of freely controlling the exposure time of an image sensor 161, and the control is performed by a system control unit 420 described below. The image sensor 161 is an image capturing device that includes an image capturing surface where an object image (optical image) having passed through a lens 501 is formed and that outputs an electrical signal (analog signal) corresponding to the optical image of the image capturing surface via photoelectric conversion. The image sensor 161 may be a Charge Couple Device (CCD) or a Complementary MOS (CMOS) sensor, for example. The image sensor 161 is included in the image capturing unit 120.

An A/D converter 412 converts an analog signal output from the image sensor 161 into a digital signal. An image processing unit 413 performs a predetermined pixel interpolation, a resizing processing such as reduction, and color conversion processing on a digital signal from the A/D converter 412 or on a digital signal from a memory control unit 422 described below and generates image data. The system control unit 420 controls the diaphragm position and the lens position on the basis of the calculation result obtained by the image processing unit 413. The image processing unit 413 also executes predetermined calculation processing using image data and TTL type auto white balance (AWB) on the basis of the obtained calculation result.

The system control unit 420 includes at least one processor or circuit and controls the entire digital camera 100. The system control unit 420 deploys a program stored in a non-volatile memory 423 on a system memory 424 and executes the program to implement the operations of each block of the digital camera 100 and processing relating to the present invention.

The non-volatile memory 423 is an electrically erasable and recordable read-only storage apparatus and stores constants, programs, and the like for the operations of the system control unit 420. The system memory 424 is a storage unit capable of reading and writing that stores constants, variables, programs read out from the non-volatile memory 423, and the like for the operations of the system control unit 420.

A memory 421 temporarily stores digital signals obtained by conversion via the A/D converter 412 and acquisition by the image sensor 161 and image data generated by the image processing unit 413. The memory 421 is provided with enough storage capacity to store a predetermined number of still images, moving images, and audio of a predetermined amount of time, and the like. The memory control unit 422 controls the transmitting and receiving of data controlled by the system control unit 420 to between the A/D converter 412, the image processing unit 413, and the memory 421. The digital signals output from the A/D converter 412 are directly written to the memory 421 via the image processing unit 413 and the memory control unit 422 or via only the memory control unit 422. Also, the memory 421 also functions as memory (video memory) for image display.

A system timer 425 is a time measuring unit that measures the time until performing auto power off where the display members described below are turned off to prevent battery consumption in a case where it is determined that the user has not operated the digital camera 100 and exposure time.

The various blocks relating to image capture are included in the control IC group 121a of the main circuit board 121.

A power supply unit 430 includes a primary battery, such as an alkaline battery and a lithium battery, a secondary battery such as a NiCd battery, a NiMH battery, and an Li battery, an AC adapter, and the like. As illustrated in FIG. 2B, the battery used in the power supply unit 430 is protected by a battery lid 108a provided on the bottom cover 108. A power supply control unit 431 includes a circuit for detecting the power supply unit 430 corresponding to the power supply for running the digital camera 100, a DC-DC converter, and a switch circuit for switching destinations of the power supply. The power supply control unit 431 detects whether a battery is installed, the type of battery, and the remaining battery level. Also, the power supply control unit 431 controls the DC-DC converter on the basis of a detection result and an instruction from the system control unit 420 and supplies the required voltage at the required timing to the supply destination.

The storage medium I/F 121b is an interface with a storage medium 600. The storage medium 600 is a storage apparatus, such as an SD card, a flash memory, a hard disk, and the like, capable of being detached from the digital camera 100 and stores captured images. In the digital camera 100, the storage medium I/F 121b is provided with an opening into which the storage medium 600 is inserted, allowing for storage onto the storage medium 600. The opening is protected by a storage medium lid 103, as illustrated in FIG. 2B.

An orientation detection unit 442 detects the orientation of the digital camera 100 with respect to the direction of gravity. The system control unit 420 is capable of outputting orientation information indicating whether the image captured by the image sensor 161 is an image that was captured with the digital camera 100 held upright or on the side on the basis of the orientation detected by the orientation detection unit 442. Also, the system control unit 420 is capable of attached the orientation information output by the orientation detection unit 442 to the image data. The orientation detection unit 442 may be an acceleration sensor, a gyro sensor, or the like, for example. The motion of the digital camera 100 (such as a pan, tilt, lift-up, and whether the digital camera 100 is at rest) can also be detected using a configuration in which an acceleration sensor and a gyro sensor are used as the orientation detection unit 442.

An eyepiece unit 443 is a portion of the digital camera 100 that the eye (object) 700 of a user (image taker) is brought toward (eye proximity). An eye-proximity detection unit 444 is an eye-approach or eye-proximity detection sensor that detects the eye 700 moving closer to (eye proximity) or away from (eye separation) the eyepiece unit 443. The eye-proximity detection unit 444 detects the proximity of the eye 700 to the eyepiece unit 443 on the basis of whether or not light is received of a light receiving unit (not illustrated) of an infrared proximity sensor, for example. From when eye proximity is detected until eye separation is detected is determined as an eye proximity state by the system control unit 420. From when eye separation is detected until eye proximity is detected is determined as a non-eye proximity state by the system control unit 420. Note that the infrared proximity sensor is an example, and another sensor capable of detecting the approach of an eye or object considered for eye proximity may be employed as the eye-proximity detection unit 444.

A back surface display unit 450 and the EVF 451 receive digital signals and image data written to the memory 421 via the memory control unit 422 and display these. The back surface display unit 450 is a liquid crystal panel, for example, and displays a preview of the captured images and various setting states by performing display according to the signals from the memory control unit 422. Also, the back surface display unit 450 is a so-called vari-angle type monitor provided in a manner allowing it to turn with respect to the digital camera 100 and is stored in a display unit storage unit 102 as illustrated in FIG. 2B. The EVF 451 performs display according to the signals from the memory control unit 422 in a case where eye proximity is detected by the eye-proximity detection unit 444. The analog signals obtained from image capture are converted to digital signals and stored in the memory 421. Thus, by successively transferring the digital signals to the back surface display unit 450 or the EVF 451 and displaying the digital signals, live view display can be implemented. The system control unit 420 switches between display (display state) and non-display (non-display state) of the back surface display unit 450 and the EVF 451 according to the state detected by the eye-proximity detection unit 444 described above. Specifically, while in a non-eye proximity state, the system control unit 420 displays the digital signals on the back surface display unit 450 and does not display the digital signals on the EVF 451. Also, while in an eye proximity state, the system control unit 420 displays the digital signals on the EVF 451 and does not display the digital signals on the back surface display unit 450.

An operation unit 460 includes various operation members for accepting an operation input from a user. When the operation unit 460 detects an operation input performed by a user, the operation unit 460 outputs a control signal corresponding to the operation input to the system control unit 420. The operation unit 460 includes a mode switching switch 461, a shutter button 462, a first shutter switch 463, a second shutter switch 464, a touch panel 465, a power switch 466, and various other similar operation members. These operation members are provided mainly on the rear cover 101 and the top cover 107 as illustrated in FIGS. 2A and 2B.

The mode switching switch 461 is an operation member for accepting switching of the control mode of the system control unit 420, and the system control unit 420 switches operation to the control mode of either the still image capturing mode or the moving image capturing mode depending on the state of the switch. Image capturing modes included in the still image capturing mode are, for example, an automatic image capturing mode, an automatic scene determination mode, a manual image capturing mode, an aperture priority mode (Av mode), a shutter speed priority mode (Tv mode), and a program AE mode (P mode). In a similar manner, the moving image capture mode may include a plurality of image capturing modes.

The shutter button 462 is an operation member for accepting an image capture preparation instruction and an image capture instruction from a user. The first shutter switch 463 turns on during the operation of the shutter button 462 provided on the digital camera 100, or in other words when half pressed (capturing preparation instruction), and generates a first shutter switch signal SW1. In response to the first shutter switch signal SW1, the system control unit 420 starts image capture preparation operations, such as autofocus (AF) processing, automatic exposure (AE) processing, automatic white balance (AWB) processing, and the like. Also, the second shutter switch 464 turns ON when the operation of the shutter button 462 is completed, or in other words when fully pressed (image capture instruction), and generates a second shutter switch signal SW2. In response to the second shutter switch signal SW2, the system control unit 420 reads out the analog signals from the image sensor 161 and performs control to executing signal conversion processing at the A/D converter 412 and the image processing unit 413. Also, the system control unit 420 executes image capture processing operations until the image data temporarily stored in the memory 421 is written to the storage medium 600 described below.

The touch panel 465 is an operation member that detects a touch operation and drag operation performed on the display surface of the back surface display unit 450 by a user. In the present embodiment, the touch panel 465 is integrally formed with the back surface display unit 450.

The power switch 466 is an operation member for accepting switching the power supply ON and OFF. The power supply control unit 431 controls the power supply from the power supply unit 430 according to the switching of the power switch 466.

Also, as illustrated in FIG. 2A, an accessory shoe 107a is provided on the top cover 107. The accessory shoe 107a is a portion provided on the outer surface of the housing of the digital camera 100 where an external apparatus such as an external microphone can be mounted. The accessory shoe 107a includes an electrical contact, and when an external apparatus with a corresponding electrical contact is mounted on the digital camera 100, the external apparatus and the digital camera 100 are electrically connected. Such an external apparatus is provided with an identification signal, and the digital camera 100 is capable of recognizing the external apparatus on the basis of the identification signal. Apparatuses able to be mounted on the accessory shoe 107a include an external strobe and an external microphone, and the user can attach and detach a desired apparatus to/from the accessory shoe 107a. For example, in a configuration in which an external microphone 107c is mounted, an audio signal acquired by the external microphone 107c can be recorded as an audio signal of the time of moving image capture. Note that when the digital camera 100 is provided in advance with a built-in microphone 107b and the external microphone 107c is not connected, an audio signal recorded at the time of moving image capture is acquired by the built-in microphone 107b.

Also, a wireless microphone 107d can be connected to the digital camera 100 according to the present embodiment via a wireless communication I/F 470. The wireless communication I/F 470 is compatible with a discretionary communication standard such as Bluetooth (registered trademark). The device that connects via the wireless communication I/F 470 acquires an identification signal and is recognized when pairing or the like is performed. In a configuration in which the wireless microphone 107d is connected, the audio signal acquired by the wireless microphone 107d via the wireless communication I/F 470 can be recorded as an audio signal of the time of moving image capture.

In this manner, the digital camera 100 according to the present embodiment can record audio of the time of moving image capture using three types of microphones, the built-in microphone 107b, the external microphone 107c, and the wireless microphone 107d. Hereinafter, to differentiate between the microphones, the built-in microphone 107b may be referred to as a first microphone, the external microphone 107c may be referred to as a second microphone, and the wireless microphone 107d may be referred to as a third microphone.

Also, the digital camera 100 according to the present embodiment includes a duct fan 123 and an internal fan 124 as heat radiation fans for radiating heat (cooling) from the internal heat-generating source structures. The duct fan 123 is a heat radiation fan for radiating heat mainly from the control IC group 121a of the main circuit board 121, i.e., a heat-generating source, and is disposed inside the duct 122. As illustrated in FIGS. 2A and 2B, the duct 122 is configured to connect a vent 110a provided on the rear cover 101 and a vent 110b provided on the side cover 109, with intake and exhaust being enabled via driving of the duct fan 123. In other words, the duct 122 takes in outside air of the digital camera 100 via the duct fan 123 to a position at or near the heat source, i.e., the control IC group 121a or the like, and produces an air flow inside the duct 122. The internal fan 124 is a heat radiation fan for radiating heat mainly from the image sensor 161, i.e., a heat-generating source, and is disposed at or near the image capturing unit 120. Details of the cooling effect of the heat radiation fans will be described below in detail using other diagrams.

A lens unit 500 is a replaceable lens detachably attached to the digital camera 100 and is mounted at a mount portion 112 of the digital camera 100. The mount portion 112 is configured so that an image capture optical axis O of the lens unit 500 and the center of the mount portion 112 are aligned when the lens unit 500 is mounted in the mount portion 112. The mount portion 112 is provided with a communication terminal 440 that comes into contact with a lens communication terminal 506 provided in the lens unit 500 when the lens unit 500 is connected, implementing an electrical connection between the digital camera 100 and the lens unit 500. Accordingly, the system control unit 420 that controls the entire digital camera 100 is able to communicate with a lens system control circuit 505 that controls the entire lens unit 500.

The lens system control circuit 505 performs position control of a diaphragm 503 by a diaphragm drive circuit 504 and focus state control by a lens drive circuit 502. The lens drive circuit 502 controls the focus state by moving the lens 501 in the image capture optical axis O. The lens 501 guides the light (object light) reflected by the object to the image sensor 161. In the example of FIG. 1, one lens is illustrated for the lens 501 for the sake of simplicity. However, the lens 501 may be a lens group including a plurality of lenses.

Detailed Description of Heat Radiation Operation

The heat radiation operation of the digital camera 100 according to the present embodiment will be described in detail below.

Around the Duct Fan

Of the components of the digital camera 100, the control IC group 121a in particular consumes a large amount of power and generates a large amount of heat. The control IC group 121a generates heat when executing various calculation processing during image capture and restricts operations when the temperature exceeds an operation assurance temperature at which the operation is assured. Accordingly, since image capture with the digital camera 100 is stopped when the control IC group 121a exceeds the operation assurance temperature, the amount of time that image capture is possible varies depending on the temperature state of the control IC group 121a. In other words, in order to maintain the image capture possible period of the digital camera 100 for a long time, control must be performed so that heat radiation or cooling is performed for the control IC group 121a, which is a heat-generating source, during operation to prevent the temperature from exceeding the operation assurance temperature. Thus, in the digital camera 100 of the present embodiment, as illustrated in FIG. 3, the duct 122 is disposed on the back surface of the main circuit board 121 and is configured to thermally connect to the control IC group 121a in a manner that allows for heat radiation.

Figure 4A:
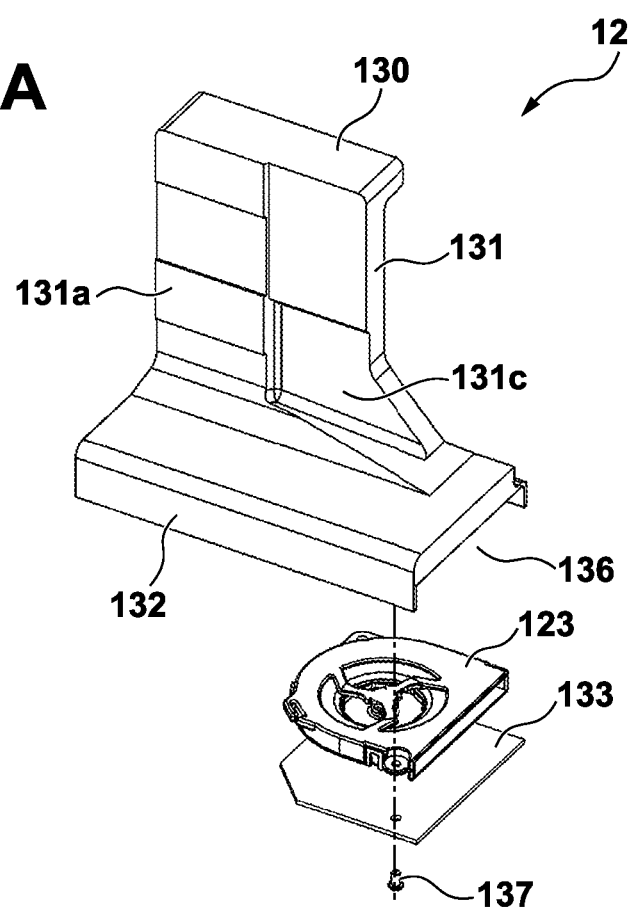
FIGS. 4A and 4B are perspective views illustrating a duct 122 according to the embodiment and the modifications of the present invention.
Figure 4B:
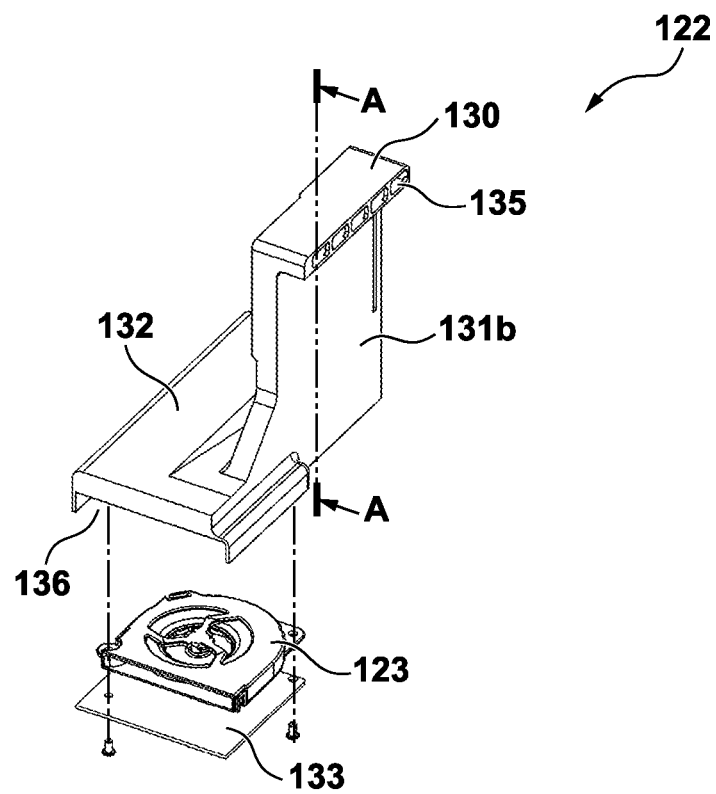
Figure 5:
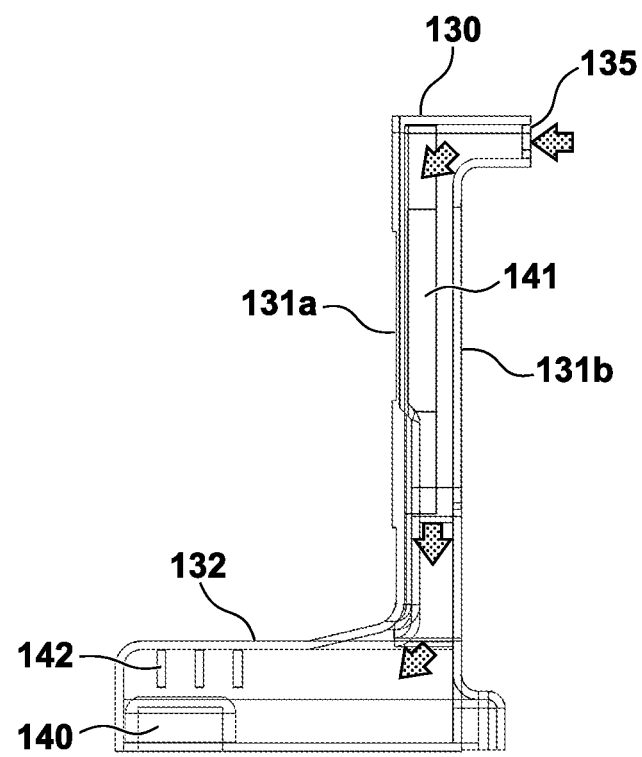
FIG. 5 is an internal structure cross-sectional view illustrating the duct 122 according to the embodiment and the modifications of the present invention.

FIG. 4A is a front surface perspective view of the duct 122, and FIG. 4B is a back surface perspective view of the duct 122. Also, FIG. 5 is an internal structure cross-sectional view of the duct 122 taken along A-A in FIG. 4B.

The duct 122 includes a first duct portion 130, a second duct portion 131, and a third duct portion 132.

The first duct portion 130 runs substantially parallel with the image capture optical axis O and is provided below the EVF 451 of the display unit storage unit 102. By disposing the first duct portion 130 near the EVF 451, the contact area between the second duct portion 131 described below and the control IC group 121a can be increased, which is advantageous from the perspective of heat radiation.

The second duct portion 131 is connected to the first duct portion 130, runs substantially perpendicular to the image capture optical axis O, and is formed located at the back surface side of the control IC group 121a of the image capturing unit 120. The second duct portion 131 is divided in a second front duct portion 131a that forms the surface that faces the control IC group 121a and a second back duct portion 131b formed on the opposite side. A second duct recess portion 131c is a recess formed in the second duct portion 131 and is provided in the surface facing the main circuit board 121 side without covering the projected surface of the control IC group 121a. The recess shape makes the cross-sectional area of the second duct portion 131 small in a local area. This allows the airflow through the second duct portion 131 to be increased near a heat transfer member 150 described below. Accordingly, heat radiation of the control IC group 121a can be efficiently performed. Since the second duct portion 131 is located at a portion that is not the projected surface of the heat source, thermal diffusion of the inside of the digital camera 100 can be efficiently performed. Thus, the portion that is not the projected surface is preferably disposed as a portion of the duct 122 as with the second duct recess portion 131c. Note that the space made by the recess portion may be used to dispose a connector portion and an FPC for connecting the image capturing unit 120 and the main circuit board 121 on the second duct recess portion 131c side of the main circuit board 121.

The third duct portion 132 is connected to the second duct portion 131, runs substantially parallel with the image capture optical axis O, and is formed located below the image capturing unit 120 and the main circuit board 121. The third duct portion 132 is provided with a bottom surface duct cover 133 which is fixed to the third duct portion 132 with a not-illustrated elastic member disposed therebetween.

A tripod socket placement portion 140 is provided as a removed portion of the third duct portion 132. The tripod socket 106 placed in the tripod socket placement portion 140 is fastened to a member with high rigidity. In the present embodiment, the tripod socket placement portion 140 is fastened to the front base 104, which is made of a magnesium alloy. In this manner, even when the digital camera 100 attached to the tripod receives a strong force from an external source, deformation of the camera overall can be suppressed due to a member with high rigidity being used for fastening. In other words, by suppressing deformation at or near the image capturing unit 120, the effects of a strong force on the captured image can be reduced. Also, by suppressing deformation of the digital camera 100 overall, deformation of the duct 122 is suppressed, giving the effect of preventing a decrease in the heat transfer efficiency.

The first duct portion 130 is provided with an inlet 135, and the third duct portion 132 is provided with an outlet 136. A not-illustrated elastic member is provided between the inlet 135 and a vent 110a provided in the rear cover 101, forming a sealed structure between the inlet 135 and the vent 110a. In a similar manner, a not-illustrated elastic member is provided between the outlet 136 and a vent 110b provided in the side cover 109, forming a sealed structure between the outlet 136 and the vent 110b. By forming the sealed structures, a single sealed space is formed between the vent 110a and the vent 110b. In this manner, an air flow path is formed and water droplets, sand, and the like can be prevented from entering inside the digital camera 100 from outside.

Note that to reduce the pressure loss at the flow path in the duct 122, the first duct portion 130, the second duct portion 131, and the third duct portion 132 preferably have substantially equal cross-sectional areas for the flow path. Even when the cross-sectional area is changed, the duct portions are configured to change very little in terms of the cross-sectional area. The first duct portion 130, the second duct portion 131, and the third duct portion 132 may be formed by separate components fastened together or may be a component integrally formed by a 3D printer or the like. Also, each connection between the duct portions may be formed via fastening or the duct portions may be integrally formed by a 3D printer or the like. In a case where the method of fixing is fastening, to maintain the hermeticity of the duct 122, preferably a not-illustrated elastic member is disposed between components. As long as a sealed space can be formed, any fastening method capable of achieving the goal may be used, including fastening via machine screws, adhesion, crimping, and the like.

Also, the material of the first duct portion 130, the second duct portion 131, and the third duct portion 132 preferably has high thermal conductivity so that heat can be efficiently transferred from the heat source. However, regarding the second back duct portion 131b, since it contributes relatively little to the thermal diffusion from the heat source, a member with a thermal conductivity less than that of the second front duct portion 131a may be used. Also, from the perspective of reducing the weight of the digital camera 100, a material with a low specific gravity is preferably used. Furthermore, by mainly using metal for the material of the duct 122, this can be used as a ground housing of the digital camera 100, which is advantageous from the perspective of noise resistance. In the present embodiment, the material of the first duct portion 130, the second front duct portion 131a, and the third duct portion 132 is aluminum, and the material of the second back duct portion 131b is polycarbonate. Note that the second back duct portion 131b is integrally formed with the rear cover 101, allowing for the thickness of the apparatus in the back surface direction to be reduced. The surface of the second front duct portion 131a on the opposite side to the main circuit board 121 is provided with a first fin portion 141 including a plurality of protrusions. This increases the surface area of the second duct portion 131 and increases the cooling efficiency by increasing the heat exchange area with the air in the duct.

The duct fan 123 is a blowing unit for producing an air flow inside the duct 122 and is fixed to the third duct portion 132 and the bottom surface duct cover 133 via a fixing machine screw 137. When the duct fan 123 is driven, air from outside the digital camera 100 enters inside the duct 122 from the inlet 135 via the vent 110a. The air taken in travels pass the first fin portion 141 inside the second duct portion 131 and then travels pass a second fin portion 142 inside the third duct portion 132. When the air taken in travels pass the first fin portion 141 and the second fin portion 142 warmed by the heat source, the fins are cooled and the heat source is cooled. The air after passing the fins is taken into the duct fan 123, travels through the outlet 136 and is discharged outside the digital camera 100 from the vent 110b.

Note that the air flow according to the present embodiment is as described above, with the air being taken in from the vent 110a and discharged to the vent 110b. This is because the outlet 136 is disposed at a position far from the face and the like of the user. However, as long as the desired cooling effect can be achieved, the placement is not limited thereto. For example, the placement of the duct 122 and the duct fan 123 may be changed, and the air may be taken in from the vent 110b and discharged to the vent 110a.

FIG. 6 is a diagram for describing the thermal connection between the duct 122 and the heat-generating source (control IC group 121a). FIG. 6 is an exploded perspective view illustrating the duct 122 and the control IC group 121a mounted on the main circuit board 121.

The heat transfer member 150 is a heat conductive rubber for thermally connecting the control IC group 121a and the second front duct portion 131a. The heat generated at the control IC group 121a is transferred to the duct 122 via the heat transfer member 150. The heat transfer member 150 comes into contact with the second duct portion 131, and, on the other side of the contact surface, the first fin portion 141 described above is provided. Thus, the heat from the control IC group 121a and the air inside the duct 122 efficiently exchange heat via the first fin portion 141. As a result, good cooling performance can be achieved. Note that in the present embodiment, the heat transfer member 150 is a heat conductive rubber, but other materials, such as metal foil, a heat pipe, and the like, may be used. Also, as long as the thermal conductivity is higher than a resin member or the like and other mechanical and electrical performances are satisfactory, the material is not limited thereto.

Around the Internal Fan

As with the control IC group 121a, the image capturing unit 120 also generates heat when in operation. The internal fan 124 as illustrated in FIG. 3 is disposed near the image capturing unit 120 with the blowing direction perpendicular to the optical axis, and by blowing air at the back surface of the image capturing unit 120, which is a heat-generating source, the image capturing unit 120 is prevented from being locally heated to a high temperature.

By disposing a blowing opening 124a to blow air in the space between the image capturing unit 120 and the main circuit board 121, the internal fan 124 can function to provide a cooling effect to both the image capturing unit 120 and the main circuit board 121. However, in a configuration including a movable portion 160 for moving the image capturing unit 120 for hand shake correction, there are few heat radiation paths. Thus, disposing the blowing opening 124a of the internal fan 124 at a position nearer to the image capturing unit 120 than the main circuit board 121 is advantageous in terms of cooling the entire digital camera 100.

Figure 7A:
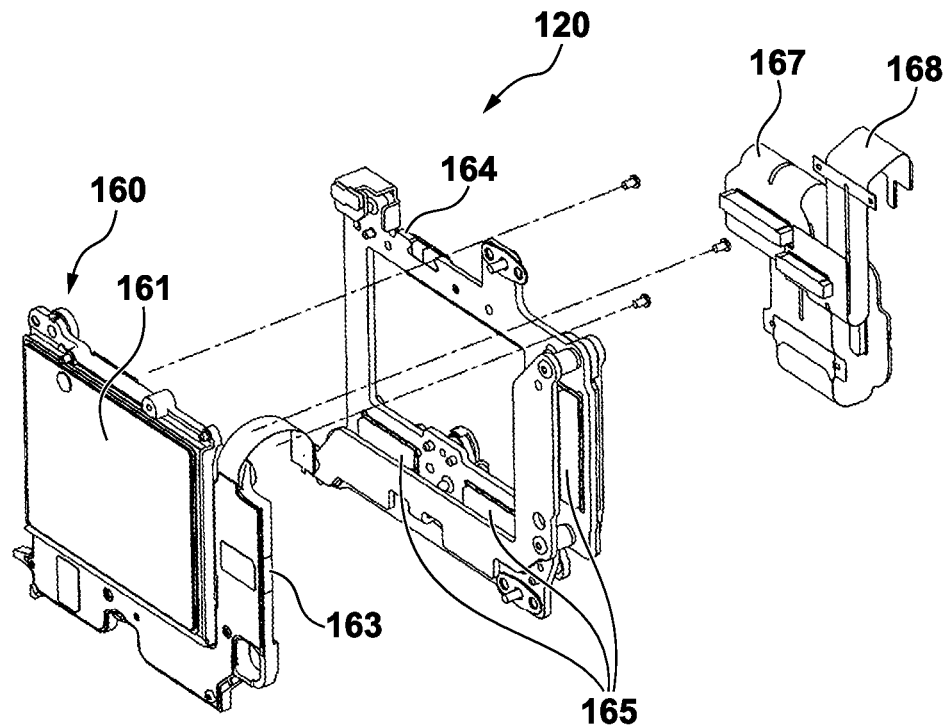
FIGS. 7A and 7B are exploded perspective views illustrating an image capturing unit 120 according to the embodiment and the modifications of the present invention.
Figure 7B:
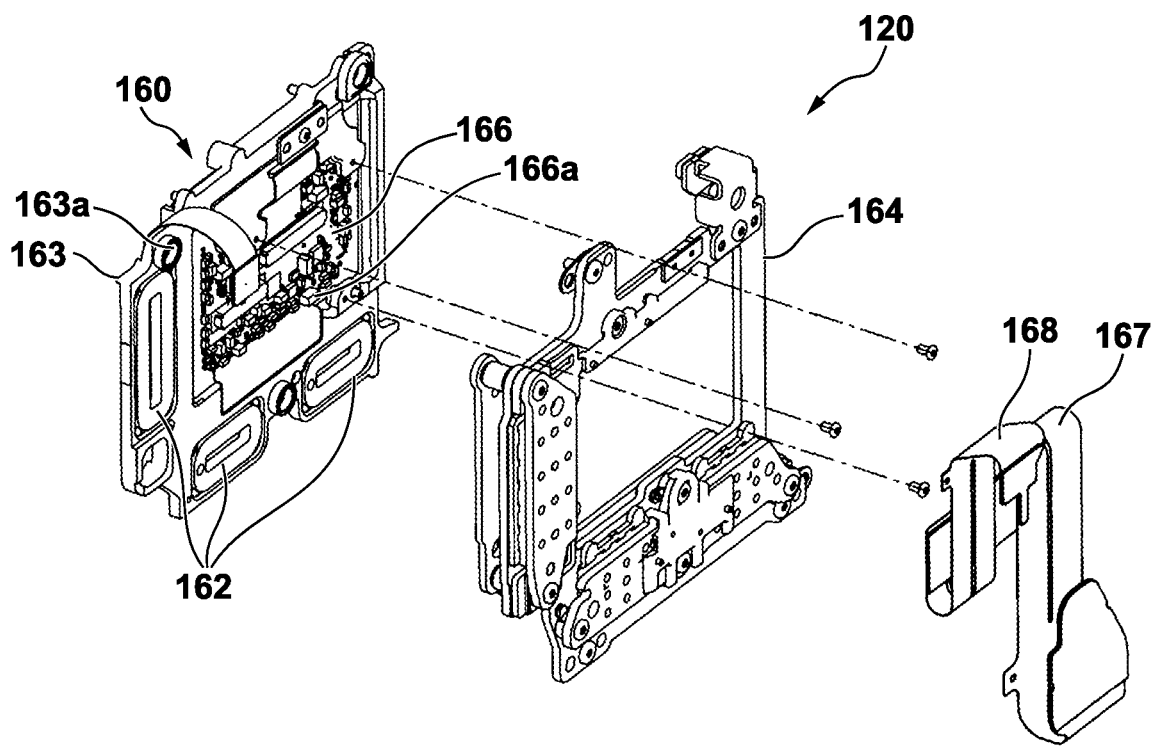

FIGS. 7A and 7B are exploded perspective views illustrating the image capturing unit 120 including the movable portion 160. FIG. 7A is a front surface exploded perspective view of the image capturing unit 120, and the FIG. 7B is a back surface exploded perspective view of the image capturing unit 120.

The movable portion 160 includes coils 162 including a coil and Hall element for moving the image sensor 161 and is held in a sensor holder 163. In the example of FIG. 7A, three magnets 165 are held in a driving mechanism 164, and the movable portion 160 is attracted to and held by the magnets 165. Between the movable portion 160 and the driving mechanism 164, not-illustrated balls are placed in ball holding portions 163a provided in the sensor holder 163. Movement of the movable portion 160 can be controlled by changing the amount of electricity flowing to the coils 162, and hand shake correction can be implemented by moving the movable portion in the direction to counteract shake of the digital camera 100 body.

In the image sensor 161, a sensor chip (not illustrated) is adhered to an image capture circuit board 166 where the image capture circuit is mounted, and the image sensor 161 is electrically connected on the image capture circuit board 166 via wire bonding. The image sensor 161 and the sensor holder 163 are adhered and fixed together via an adhesive. On the back surface of the image capture circuit board 166, which is the surface where the sensor chip is bonded, an element 166a, such as a capacitor, resistor, regulator, or the like of the image capture circuit, is mounted.

The image capturing unit 120 and the main circuit board 121 are electrically connected using a flexible wiring board. A captured image signal flexible joint 167 is a wiring line for communicating a captured image signal output from the image sensor 161 and a control signal required for driving the image sensor 161 and transmits signal to the control IC group 121a on the main circuit board 121. An image capture power supply flexible joint 168 supplies power for driving the image sensor 161. The connection between the image capture circuit board 166 and the captured image signal flexible joint 167 and the image capture power supply flexible joint 168 uses an inter-board connector.

Figure 8A:
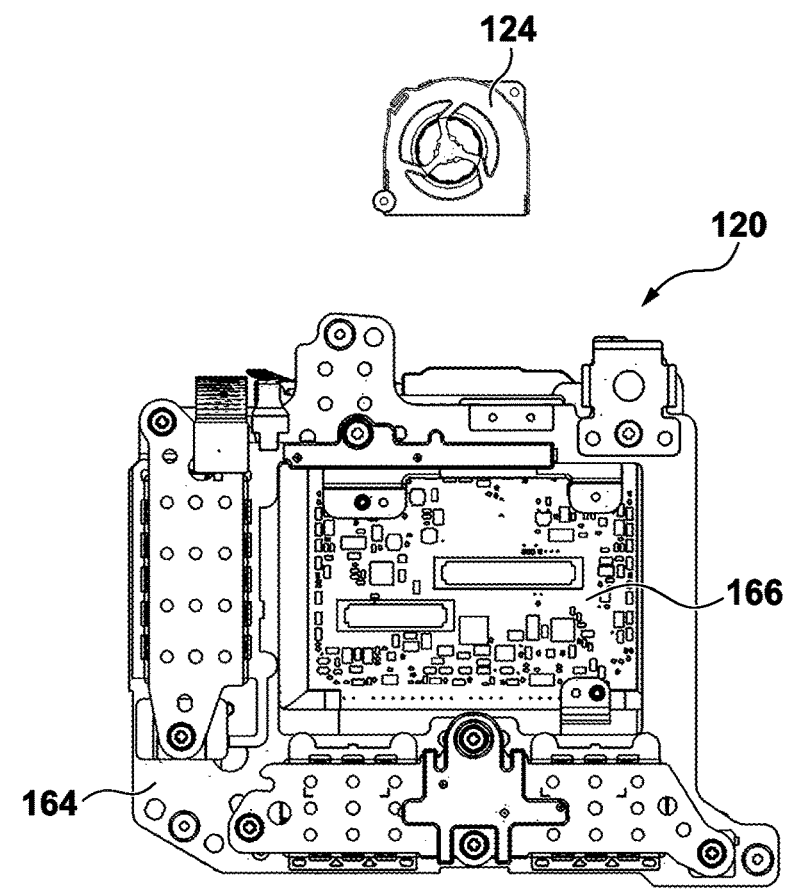
FIGS. 8A and 8B are diagrams illustrating the relationship between the image capturing unit 120 and an internal fan 124 according to the embodiment and the modifications of the present invention.

Here, the movement of the movable portion 160 of the image capturing unit 120 and the positional relationship of the internal fan 124 will be described with reference to FIGS. 8A and 8B. FIG. 8A is a diagram illustrating the internal fan 124 and the image capturing unit 120 as seen from the back surface, and FIG. 8B is a schematic diagram of the internal fan 124 and the image capturing unit 120.

Figure 8B:
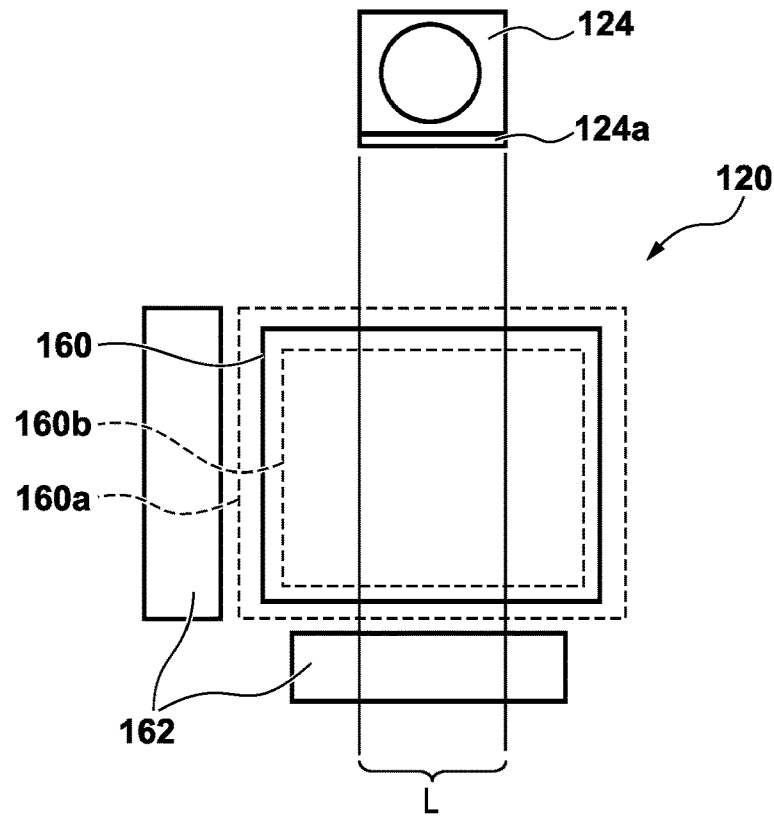

The movable portion 160 is capable of moving along a plane orthogonal to the image capture optical axis O, and this movement range is indicated by 160a in FIG. 8B. Also a range 160b indicates a region in which the movable portion 160 is always located even when the movable portion 160 is moved to any position in the movement range 160a. The blowing opening 124a of the internal fan 124 is provided so that air is blown in the range 160b. More specifically, by disposing the internal fan 124 with a blowing area indicated by L included in the range 160b, a cooling effect of the image sensor 161 is obtained even when the image sensor 161 is moved to any position by the driving mechanism 164. Also, the internal fan 124 is not physically in contact with the movable portion 160. Thus, the function of hand shake correction is not inhibited by the movable portion 160.

In this manner, the digital camera 100 according to the present embodiment includes the built-in duct fan 123 and internal fan 124. Thus, an increase in the temperature of the control IC group 121a and the image sensor 161 can be suppressed. As a result, in the digital camera 100, the temperature is unlikely to rise due to heat generation and reach the operation assurance temperature that restricts function. By performing analysis using FEM and comparing this configuration to a configuration in which the duct fan 123 and the internal fan 124 are not built-in, it is clear that the temperature of the control IC group 121a and the image sensor 161 of digital camera 100 according to the present embodiment is lower by 6° C. or more.

Note that in the present embodiment described above, the internal fan 124 is disposed with the blowing direction orthogonal to the image capture optical axis O. However, the present invention is not limited thereto. Regarding the arrangement of the internal fan 124, it is sufficient that the produced airflow directly contacts the image capturing unit 120, and the blowing direction does not need to be orthogonal to the image capture optical axis O.

Also, in the present embodiment described above, a centrifugal fan is used as the duct fan 123 and the internal fan 124. However, the present invention is not limited thereto. One or more of these heat radiation fans may be a different type of fan such as an axial fan, for example.

Drive Control when Recording Audio

When such heat radiation fans are driven, fan rotation sound may be produced and recorded as noise at the time of moving image capture. The rotation sound of the heat radiation fan tends to increase proportionally with the rotation frequency. Thus, by decreasing the rotation frequency of the heat radiation fan at the time of moving image capture, the effects of noise can be decreased. However, decreasing the rotation frequency of the heat radiation fan leads to a decrease in the cooling effect, resulting in a trade-off with the length of recordable time.

Also, the effects of the rotation sound on the audio recorded at the time of moving image capture (hereinafter, also referred to as recorded audio) are different depending on the microphone used to acquire audio. For example, the effects of rotation sound are different for the built-in microphone 107b (first microphone) installed in the digital camera 100, the external microphone 107c (second microphone) mounted on the accessory shoe 107a of the housing, and the wireless microphone 107d (third microphone) wirelessly connected. This is due to the differences in the placement position and rotation sound propagation path. Typically, the built-in microphone 107b tends to pick up more rotation sound than the external microphone 107c. Also, since the wireless microphone 107d tends to be used without being mounted on the digital camera 100, the wireless microphone 107d tends to pick up less rotation sound than the external microphone 107c.

Accordingly, depending on which microphone is being used to record audio at the time of moving image capture, the rotation frequency of the heat radiation fan at which noise is not recorded differs. In the digital camera 100 of the present embodiment, the rotation frequency of the heat radiation fan at the time of moving image capture is controlled according to the type of microphone used to record audio. More specifically, depending on which one of the first microphone, the second microphone, and the third microphone is being used to record audio at the time of moving image capture, the system control unit 420 performs control to operate the heat radiation fan at a rotation frequency such that rotation sound is not recorded by the microphone.

Drive Control Processing

Figure 9:
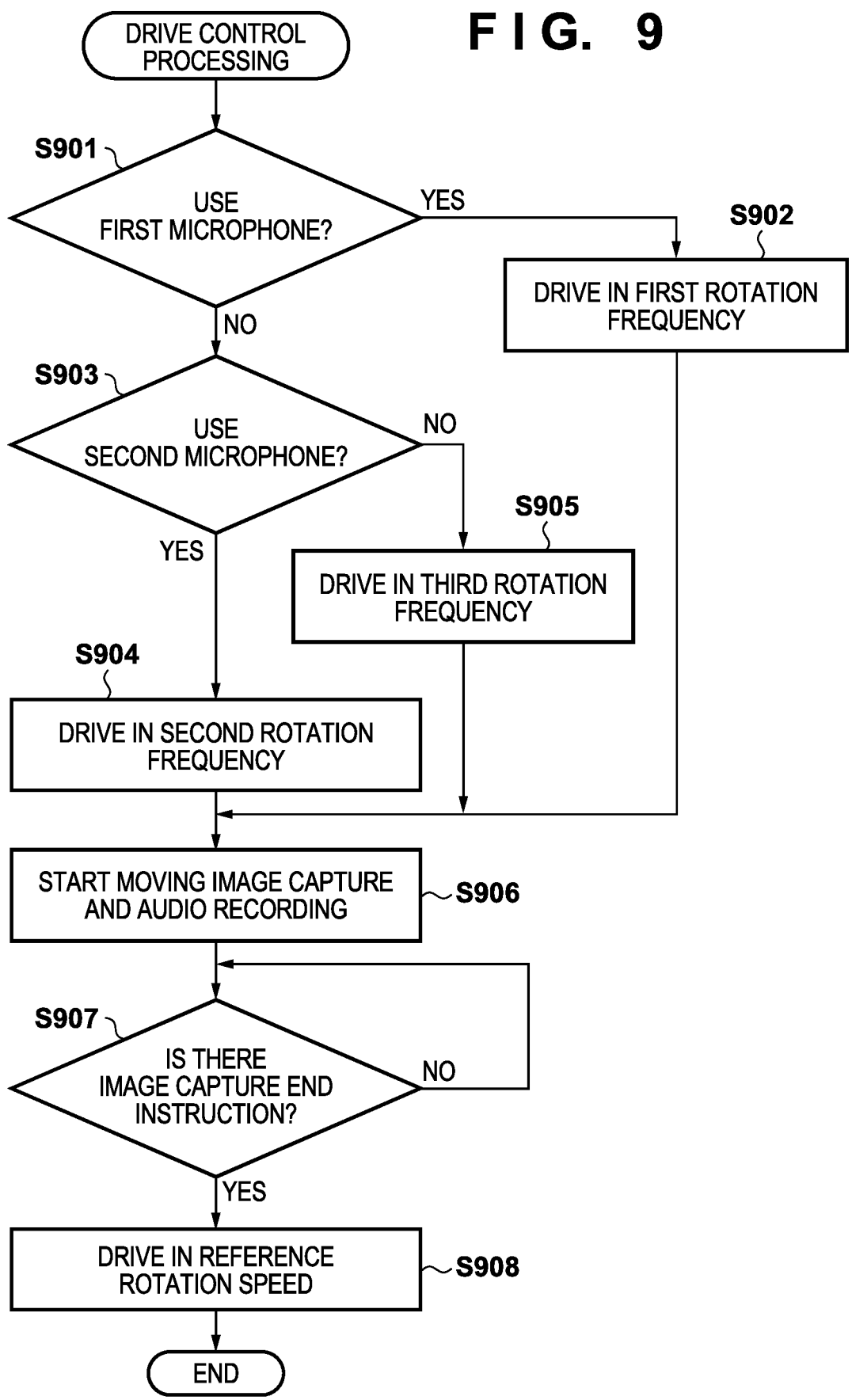
FIG. 9 is a flowchart illustrating an example of drive control processing executed by the digital camera 100 according to the embodiment of the present invention.

The drive control processing for a heat radiation fan executed at the time of moving image capture in the digital camera 100 according to the present embodiment will be described below in detail using the flowchart of FIG. 9. The processing corresponding to the flowchart can be implemented by the system control unit 420 reading out the corresponding processing programs stored in the non-volatile memory 423, for example, deploying them on the system memory 424, and executing them. The present drive control processing described herein is started when, in the moving image capture mode, an operation input relating to an image capture start instruction is detected, for example.

Note that in the example of present drive control processing described herein, in order to reduce the rotation sound of the duct fan 123 that may propagate to the microphone via the vents 110a and 110b, the system control unit 420 performs drive control to control the rotation frequency of the duct fan 123. However, in the present invention, this is not limited to the duct fan 123, and it should be easily understood that this is also applicable to configurations in which the internal fan 124 is used as the heat radiation fan in a similar manner or the duct fan 123 and the internal fan 124 are used as the heat radiation fan.

The drive control processing starts when the audio recording for moving image capture has not yet started. Thus, at this time, the duct fan 123 is controlled and driven at a predetermined normal-time rotation frequency (reference rotation frequency). In the example described here, reference rotation frequency is a value greater than a first rotation frequency, a second rotation frequency, and a third rotation frequency described below. However, the value may be discretionarily set by the user.

In step S901, the system control unit 420 determines whether or not the microphone used to record audio at the time of moving image capture is the first microphone, i.e., the built-in microphone 107b. Information of the microphone in use is set before an operation input relating to an image capture start instruction is performed and stored in the memory 421, for example. This may be set on the basis of an operation input by the user, and may be changed according to whether the external microphone 107c is attached to the accessory shoe 107a or the wireless microphone 107d is connected. In a case where the system control unit 420 determines that the microphone used to record audio is the first microphone, the processing moves to step S902. In a case where the system control unit 420 determines that it is not the first microphone, i.e., it is a non-built-in microphone, the processing moves to step S903.

In step S902, the system control unit 420 changes the rotation frequency from the reference rotation frequency to the first rotation frequency and drives the duct fan 123. Here, the first rotation frequency is the lowest rotation frequency among the first to third rotation frequency. The first rotation frequency may be a predetermined value based on actual measurement that is the maximum value for the rotation frequency that does not produce effects of the rotation sound of the duct fan 123 in the audio recorded by the built-in microphone 107b, for example.

Also, in a case where the microphone used to record audio is determined to not be the first microphone in step S901, in step S903, the system control unit 420 determines whether or not the microphone used to record audio at the time of moving image capture is the second microphone, i.e., the external microphone 107c. The determination of the present step is performed on the basis of whether the microphone in use is the external microphone 107c connected via the electrical contact of the accessory shoe 107a or the wireless microphone 107d wirelessly connected via the wireless communication I/F 470. In a case where the system control unit 420 determines that the microphone used to record audio is the second microphone, the processing moves to step S904. Also, in a case where the system control unit 420 determines that the microphone used to record audio is not the second microphone, i.e., is the third microphone (wireless microphone 107d), the processing moves to step S905.

In step S904, the system control unit 420 changes the rotation frequency from the reference rotation frequency to the second rotation frequency and drives the duct fan 123. Here, the second rotation frequency is a rotation frequency higher than the first rotation frequency and lower than the third rotation frequency. The second rotation frequency may be a predetermined value based on actual measurement that is the maximum value for the rotation frequency that does not produce effects of the rotation sound of the duct fan 123 in the audio recorded by the external microphone 107c, for example. Here, the external microphone 107c able to be installed on the accessory shoe 107a may be one distributed by various makers. Thus, the second rotation frequency may be different depending on the type of the external microphone 107c used. The type of the external microphone 107c used can be identified on the basis of an identification signal received from the external microphone 107c via the electrical contact of the accessory shoe 107a. In this case, for example, information (management table) of the maximum rotation frequency that does not produce effects in the audio recording for each type of external microphone 107c is stored in the non-volatile memory 423, and the system control unit 420 sets the second rotation frequency according to the type of the mounted external microphone 107c.

On the other hand, in a case where the microphone used to record audio is determined to not be the second microphone in step S903, the system control unit 420, in step S905, changes the rotation frequency from the reference rotation frequency to the third rotation frequency and drives the duct fan 123. Here, the third rotation frequency is the highest rotation frequency among the first to third rotation frequency. As with the first rotation frequency and the second rotation frequency, the third rotation frequency may be a predetermined value based on actual measurement that is the maximum value for the rotation frequency that does not produce effects of the rotation sound of the duct fan 123 in the audio recorded by the wireless microphone 107d, for example. Alternatively, the wireless microphone 107d may not be mounted on the housing of the digital camera 100 and may be mounted on the image taker, object, or the like, and the third rotation frequency may be the same value as the reference rotation frequency or the highest rotation frequency able to be set for the duct fan 123. In other words, as opposed to the built-in microphone 107*b* and the external microphone 107*c*, when the wireless microphone 107*d*, which is used at a distance from the digital camera 100, is used to record audio, the duct fan 123 can be operated at a rotation frequency without worrying about producing a rotation sound.

After controlling the rotation frequency of the duct fan 123 according to the microphone in use in this manner, the system control unit 420, in step S906, start processing relating to moving image capture and audio recording. Note that the management table described herein stores information of the rotation frequency the duct fan 123 is driven at when recording audio for each type of external microphone 107*c*. However, information of the first rotation frequency and the third rotation frequency may also be stored.

In step S907, the system control unit 420 determines whether or not an operation input relating to an image capture end instruction has been performed. In a case where the system control unit 420 determines that an operation input relating to an image capture end instruction has been performed, the processing moves to step S908. In a case where the system control unit 420 determines that an operation input has not be performed, the processing of the present step is repeated.

In step S908, the system control unit 420 stops the processing relating to moving image capture and audio recording, returns the rotation frequency to the reference rotation frequency and drives the duct fan 123, and ends the present drive control processing.

In this manner, according to an audio recording apparatus of the present embodiment, the cooling effect on a heat generating portion can be ensured and audio can be recorded with a heat radiation fan being driven at a suitable rotation frequency.

Note that in the drive control processing described above, the rotation frequency of the duct fan 123 is controlled according to the type of microphone used to record audio. However, in a case where the present invention is applied to control of the rotation frequency of the internal fan 124, the following can be applied, for example. When capturing moving images while also recording audio, the system control unit 420 drives the internal fan 124 after changing the rotation frequency from the reference rotation frequency set for the internal fan 124 to a rotation frequency in accordance with the type of microphone in use. At this time, the relationship between the rotation frequency applied when the microphone in use is the first microphone, the rotation frequency applied when the microphone in use is the second microphone, and the rotation frequency applied when the microphone in use is the third microphone is the same as that for the duct fan 123. In other words, the relationship of the rotation frequency applied when the microphone in use is the first microphone being less than the rotation frequency applied when the microphone in use is the second microphone and the rotation frequency applied when the microphone in use is the second microphone being less than the rotation frequency applied when the microphone in use is the third microphone is maintained. Also, regarding the rotation sound of the duct fan 123 and the rotation sound of the internal fan 124, the amount of sound and the propagation path to the microphone are different. Thus, these rotation frequencies do not need to be the same as those applied for the duct fan 123, and the magnitude relationship is not limited. Also, the information of each rotation frequency for the internal fan 124 is stored in the non-volatile memory 423 as a management table as with the duct fan 123.

First Modification

In the embodiment described above, the information of the rotation frequency of the heat radiation fan when the external microphone 107*c* is used is stored in advance in a management table. However, the present invention is not limited thereto. In other words, it is not necessary to anticipate connection of all of the types of the external microphone 107*c* and store in advance the information of the appropriate rotation frequency for audio recording in a management table. For example, in a case where the external microphone 107*c* with an identification signal with no information for it in the management table is connected, calibration of the external microphone 107*c* is performed and, on the basis of the result, new information may be added to the management table.

The calibration can be performed by the following process, for example. The system control unit 420 first drives the duct fan 123 while changing the rotation frequency from the minimum rotation frequency to the maximum rotation frequency and then records audio using the connected external microphone 107*c*. Then, the system control unit 420 performs a frequency analysis of the recorded audio, identifies a rotation frequency (rotation frequency that does not produce effects of the rotation sound in the audio recording) with an audio level of a predetermined frequency of the rotation sound of the duct fan 123 equal to or less than a threshold, and associates this with an identification signal and stores it in the management table. In this manner, thereafter, when the external microphone 107*c* is connected, the duct fan 123 can be driven at an appropriate rotation frequency at the time of moving image capture.

Second Modification

In the embodiment described above, in the management table, the second rotation frequency is set for each type of external microphone 107*c* used for audio recording. However, the present invention is not limited thereto. The external microphones 107*c* may have different characteristics, and the second rotation frequency for each characteristics may be set.

An example of a characteristic of a microphone is directionality, for example, and the effects relating to audio recording of the rotation sound of the heat radiation fan differs depending on whether there is directionality or not and whether the directionality is high or low. In other words, compared to a non-directional external microphone 107*c* with no directionality, a unidirectional external microphone 107*c* configured to pick up sound in a specific direction is less likely to pick up the rotation sound of the heat radiation fan. In other words, the effects of the rotation sound of the heat radiation fan relating to audio recording are less likely to occur when the later external microphone 107*c* is used as opposed to the former external microphone 107*c*. Accordingly, in a case where the external microphone 107*c* with high directionality is used, compared to a case where the external microphone 107*c* with low directionality is used, the system control unit 420 performs control to drive the heat radiation fan at the second rotation frequency with a high value.

Accordingly, in the management table, the information of the rotation frequency (second rotation frequency) for driving the heat radiation fan for each directionality of the external microphone 107c is stored. Alternatively, depending on the external microphone 107c, some are able to switch directionality. Thus, the management table may store information of the rotation frequency for driving the heat radiation fan for each combination of the type of the external microphone 107c and the operating directionality.

Third Modification

In the second modification described above, the second rotation frequency is changed according to the characteristics of the external microphone 107c. However, the present invention is not limited thereto, and a configuration can be applied in which the rotation frequency of the heat radiation fan is changed according to the characteristics of the microphone used to record audio. In other words, the present invention may be applied to the digital camera 100 provided with a plurality of built-in microphones with different directionality, for example, and in this case, the first rotation frequency may be changed according to which one of the built-in microphones is used. Also, it goes without saying that such control may be perform for the third microphone.

Fourth Modification

In the embodiment described above, the third microphone is the wireless microphone 107d. However, the present invention is not limited thereto. In other words, the third microphone may not be a microphone installed inside the digital camera 100 or mounted on the housing, and, for example, may be a microphone with a wired connection via the external communication terminal 121c or a microphone that synchronizes with the moving image capture of another apparatus and records audio without an electrical connection.

Fifth Modification

In the embodiment described above, the control of the rotation frequency for driving the heat radiation fan is perform in accordance with which one of the first microphone, the second microphone, and the third microphone is in use. However, the present invention is not limited thereto. Moving image capture is not limited to being performed together with audio recording, and in a case where there is no audio recording, control may be performed to drive the heat radiation fan at a rotation frequency with a higher value than the first rotation frequency and the second rotation frequency such as the reference rotation frequency.

Sixth Modification

In the embodiment and the modifications described above, the present invention is applied to an image capturing apparatus (digital camera 100) capable of capturing moving images while recording audio. However, the present invention is not limited thereto. The present invention can be applied to any audio recording apparatus provided with a heat radiation fan, and an image capture function is not required.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-205467, filed Dec. 17, 2021, which is hereby incorporated by reference herein in its entirety.

What is claimed is:

1. An audio recording apparatus provided with a heat radiation fan comprising at least one processor and/or circuit configured to function as following units:
    an acquiring unit configured to acquire a type of microphone used to record audio;
    a control unit configured to control a rotation frequency for driving the heat radiation fan; and
    a recording unit configured to record audio acquired by the used microphone, wherein
    the control unit changes the rotation frequency of the heat radiation fan according to the type of the used microphone acquired by the acquiring unit.

2. The audio recording apparatus according to claim 1, wherein
    the used microphone includes a microphone with different directionalities, and
    the control unit changes the rotation frequency of the heat radiation fan according to a directionality of the used microphone.

3. The audio recording apparatus according to claim 1, wherein
    the used microphone includes a microphone with settable different directionalities, and
    the control unit changes the rotation frequency of the heat radiation fan according to a set directionality of the used microphone.

4. The audio recording apparatus according to claim 2, wherein
    in a case where the used microphone is a microphone with a first directionality, the control unit controls the rotation frequency of the heat radiation fan to a higher value than in a case where a microphone with a second directionality lower in directionality than the first directionality is used to record audio.

5. The audio recording apparatus according to claim 1, wherein
the used microphone includes a built-in microphone built inside the audio recording apparatus and a non-built-in microphone not built inside the audio recording apparatus, and
in a case where the used microphone is the non-built-in microphone, the control unit controls the rotation frequency of the heat radiation fan to a higher value than in a case where the built-in microphone is used to record audio, and further changes the rotation frequency of the heat radiation fan according to a type of the non-built-in microphone.

6. The audio recording apparatus according to claim 5, wherein
the control unit changes the rotation frequency of the heat radiation fan according to whether or not the used microphone is the non-built-in microphone mounted on a housing of the audio recording apparatus.

7. The audio recording apparatus according to claim 6, wherein
in a case where the used microphone is the non-built-in microphone not mounted on the housing of the audio recording apparatus, the control unit controls the rotation frequency of the heat radiation fan to a higher value than in a case where the non-built-in microphone mounted on the housing of the audio recording apparatus is used.

8. The audio recording apparatus according to claim 6, wherein
the control unit determines whether or not the non-built-in microphone is mounted on the housing of the audio recording apparatus on the basis of whether or not the non-built-in microphone is electrically connected via an electrical contact provided on the housing of the audio recording apparatus.

9. The audio recording apparatus according to claim 6, wherein
in a case where the non-built-in microphone is a wirelessly connected microphone, the control unit determines that the non-built-in microphone is not mounted on the housing of the audio recording apparatus.

10. The audio recording apparatus according to claim 1, wherein
the at least one processor and/or circuit further function as a management unit configured to manage information, for each type of the used microphone, of rotation frequency with an audio level of a predetermined frequency that is produced when the heat radiation fan is driven and that is equal to or less than a threshold, and
the control unit drives the heat radiation fan at a rotation frequency managed by the management unit for a type of the used microphone.

11. An image capturing apparatus capable of capturing moving images comprising:
an image capturing unit; and
the audio recording apparatus according to claim 1.

12. A control method for an audio recording apparatus provided with a heat radiation fan comprising:
acquiring a type of microphone used to record audio;
controlling a rotation frequency for driving the heat radiation fan; and
recording audio acquired by the used microphone, wherein
in the controlling, control is performed to change a rotation frequency of the heat radiation fan according to the acquired type of the used microphone.

13. A computer-readable storage medium storing a program configured to cause a computer provided with a heat radiation fan to function as the units of the audio recording apparatus according to claim 1.

* * * * *